US008836525B2

(12) United States Patent
Aceña et al.

(10) Patent No.: US 8,836,525 B2
(45) Date of Patent: Sep. 16, 2014

(54) ISOLATED RESISTIVE CURRENT SENSOR

(75) Inventors: Miguel Angel Aceña, Valls (ES);
Youssef Ghabbour, Valls (ES)

(73) Assignee: Lear Corporation, Southfield, MI (US)

( * ) Notice: Subject to any disclaimer, the term of this patent is extended or adjusted under 35 U.S.C. 154(b) by 612 days.

(21) Appl. No.: 13/154,409

(22) Filed: Jun. 6, 2011

(65) Prior Publication Data

US 2012/0306657 A1    Dec. 6, 2012

(51) Int. Cl.
| | |
|---|---|
| G08B 21/00 | (2006.01) |
| G01R 19/165 | (2006.01) |
| H04L 25/02 | (2006.01) |
| G11C 7/10 | (2006.01) |
| G01R 15/04 | (2006.01) |
| G01R 19/25 | (2006.01) |
| G01R 1/20 | (2006.01) |
| G01R 15/18 | (2006.01) |

(52) U.S. Cl.
CPC .......... *G01R 19/165* (2013.01); *H04L 25/0266* (2013.01); *G11C 7/1051* (2013.01); *G01R 15/04* (2013.01); *G01R 19/25* (2013.01); *G01R 1/203* (2013.01); *G01R 15/183* (2013.01); *G01R 19/16571* (2013.01)
USPC ........ 340/664; 340/650; 340/638; 324/76.11; 324/123 R; 324/126; 341/143; 341/155

(58) Field of Classification Search
CPC ............ H04L 25/0266; H04L 25/0282; G11C 7/1051; G11C 7/1057; G11C 7/106; H02M 3/157; H02H 3/042
USPC ........... 340/664, 650, 638; 324/76.11, 123 R, 324/126, 118; 341/143, 155, 166; 702/61, 702/64; 361/115
See application file for complete search history.

(56) References Cited

U.S. PATENT DOCUMENTS

| | | | |
|---|---|---|---|
| 4,677,536 A | 6/1987 | Pepper | |
| 5,084,633 A | 1/1992 | Izadinia | |
| 5,274,350 A | 12/1993 | Larson | |
| 5,446,372 A | 8/1995 | Berkcan | |
| 5,457,591 A | 10/1995 | Mock et al. | |

(Continued)

FOREIGN PATENT DOCUMENTS

| | | |
|---|---|---|
| CN | 1408066 A | 4/2003 |
| CN | 2585242 Y | 11/2003 |

(Continued)

OTHER PUBLICATIONS

DE Office Action dated Jul. 4, 2014 for DE102012209182.3.

(Continued)

*Primary Examiner* — Hoi Lau
(74) *Attorney, Agent, or Firm* — Brooks Kushman P.C.

(57) ABSTRACT

An isolated current-sensing system for use with a resistive current sense element includes an analog front-end configured to receive a voltage from the resistive current sense element, and to provide an analog output. A processing circuit receives the analog output, and provides a measurement signal indicative of the sensed current. An isolation circuit provides an isolation barrier, and is configured to pass the measurement signal. A programmable over-current protection alarm may be included, and configured to generate an alarm signal when the analog output exceeds a programmable threshold. The processing circuit may include a voltage-to-PWM converter.

20 Claims, 4 Drawing Sheets

(56) References Cited

U.S. PATENT DOCUMENTS

| | | |
|---|---|---|
| 5,552,979 A | 9/1996 | Gu et al. |
| 5,610,532 A | 3/1997 | Smith |
| 6,232,902 B1* | 5/2001 | Wada ............................. 341/143 |
| 6,570,373 B1 | 5/2003 | Viola |
| 7,309,980 B2 | 12/2007 | Mende et al. |
| 7,495,541 B2 | 2/2009 | Shoji |
| 8,271,216 B2* | 9/2012 | White et al. .................... 702/61 |
| 2005/0212505 A1* | 9/2005 | Murray et al. ................. 324/126 |
| 2006/0238253 A1* | 10/2006 | Ohashi et al. ................. 330/254 |
| 2008/0191685 A1* | 8/2008 | Dhuyvetter et al. .......... 324/118 |
| 2008/0258956 A1* | 10/2008 | Konrad et al. ................ 341/155 |
| 2008/0272952 A1* | 11/2008 | Wood ............................. 341/166 |
| 2010/0023283 A1* | 1/2010 | Boutorabi et al. ............. 702/60 |
| 2010/0207605 A1 | 8/2010 | Nakahara |
| 2011/0184675 A1* | 7/2011 | White et al. .................... 702/61 |

FOREIGN PATENT DOCUMENTS

| | | |
|---|---|---|
| CN | 1530661 A | 9/2004 |
| CN | 101231311 A | 7/2008 |
| CN | 101299386 A | 11/2008 |
| CN | 201477139 U | 5/2010 |
| CN | 201497766 U | 6/2010 |
| CN | 101776707 A | 7/2010 |
| CN | 201535797 U | 7/2010 |
| DE | 112009001796 T5 | 6/2011 |

OTHER PUBLICATIONS

CN Office Action dated Apr. 21, 2014 for CN201210160492.1.

* cited by examiner

ISOLATED RESISTIVE CURRENT SENSOR

TECHNICAL FIELD

The invention relates to an isolated resistive current sensor.

BACKGROUND

Electric vehicles (EVs), hybrid electric vehicles (HEVs), and plug-in hybrid electric vehicles (PHEVs) are becoming widespread. EV, HEV, and PHEV vehicles use power electronics systems to perform various functions, for example, battery chargers, inverters, DC/DC converters. The use of integrated power modules is typical in EV, HEV, and PHEV vehicles. These power modules perform power processing functions such as rectification, DC-DC conversion, DC-AC conversion, AC-DC conversion by means of high voltage silicon devices driven and controlled by system controllers, also referred to as control boards.

The control boards are usually located in the low-voltage network of the vehicle. The controllers implement the control loop of the entire power electronics system. Accordingly, the controllers need isolated measurements of critical signals from the high-voltage side of the power plant. For example, isolated measurements of input or output voltages and currents may be needed.

Existing current sensors for power electronics applications include closed-loop hall-effect sensors and magneto-resistive sensors. Hall-effect and magneto-resistive sensors provide isolation, and typically provide only the measurement signal. Shunt-based sensors also exist, and typically provide non-isolated measurement.

Further background information may be found in U.S. Pat. Nos. 4,677,536, 5,084,633, 5,274,350, 5,446,372, 5,457,591, 5,552,979, 5,610,532, 6,570,373, 7,309,980, 7,495,541. Further background information may be found in U.S. Pub. No. 2010/0023283.

SUMMARY

It is an object of the invention to provide an improved isolated current-sensing system for use with a resistive current sense element.

In one embodiment, an isolated current-sensing system for use with a resistive current sense element comprises an analog front-end, a programmable over-current protection alarm, a processing circuit, and an isolation circuit. The analog front-end is configured to receive a voltage from the resistive current sense element. The analog front-end provides an analog output. The programmable over-current protection alarm is configured to receive a programming signal indicative of a threshold. The programmable over-current protection alarm also receives the analog output, and generates an alarm signal when the analog output exceeds the threshold.

The processing circuit is configured to receive the analog output, and to provide a measurement signal indicative of the sensed current. The isolation circuit provides an isolation barrier, and is configured to pass the programming signal, the alarm signal, and the measurement signal.

It is appreciated that embodiments of the invention may be implemented in a variety of ways. The system may include the resistive current sense element connected to the analog front-end. The analog front-end may be implemented in various ways as appropriate for the particular application. For example, the analog front-end may be further configured to provide input filtering for the voltage from the resistive current sense element, and further may be configured to amplify the voltage from the resistive current sense element to provide the analog output.

The processing circuit may further comprise an analog-to-digital converter configured to receive the analog output, and configured to provide the measurement signal as a digital output indicative of the sensed current. In more detail, one implementation of the analog-to-digital converter further comprises a waveform generator circuit; and a comparison circuit. The comparison circuit compares the analog output and a generated waveform to produce the digital output indicative of the sensed current. The digital output may take the form of a pulse width modulated signal.

The programmable over-current protection alarm may be configured to convert the programming signal into a DC voltage representing the threshold, and include a comparison circuit for comparing the analog output to the DC voltage and generating the alarm signal.

In another embodiment, an isolated current-sensing system for use with a resistive current sense element comprises an analog front-end, an analog-to-digital converter, and an isolation circuit. The analog front-end is configured to receive a voltage from the resistive current sense element. The analog front-end provides an analog output. The analog-to-digital converter includes a waveform generator circuit and a comparison circuit. The comparison circuit receives the analog output and compares the analog output and a generated waveform to produce a measurement signal as a digital output indicative of the sensed current. The isolation circuit provides an isolation barrier, and passes the measurement signal.

Various embodiments of the invention may include any one or more of the various contemplated features, depending on the application. It is appreciated that embodiments of the invention have many advantages and useful applications. For example, embodiments of the invention may be suitable for an isolated current-sensing system with a programmable over-current protection alarm for automotive integrated power module applications, or other applications. In one particular application, a complete application-specific isolated current measurement probe with an alarm signal to fast detect a current level over a threshold that can be programmed externally by, for example, a high-level controller is provided.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
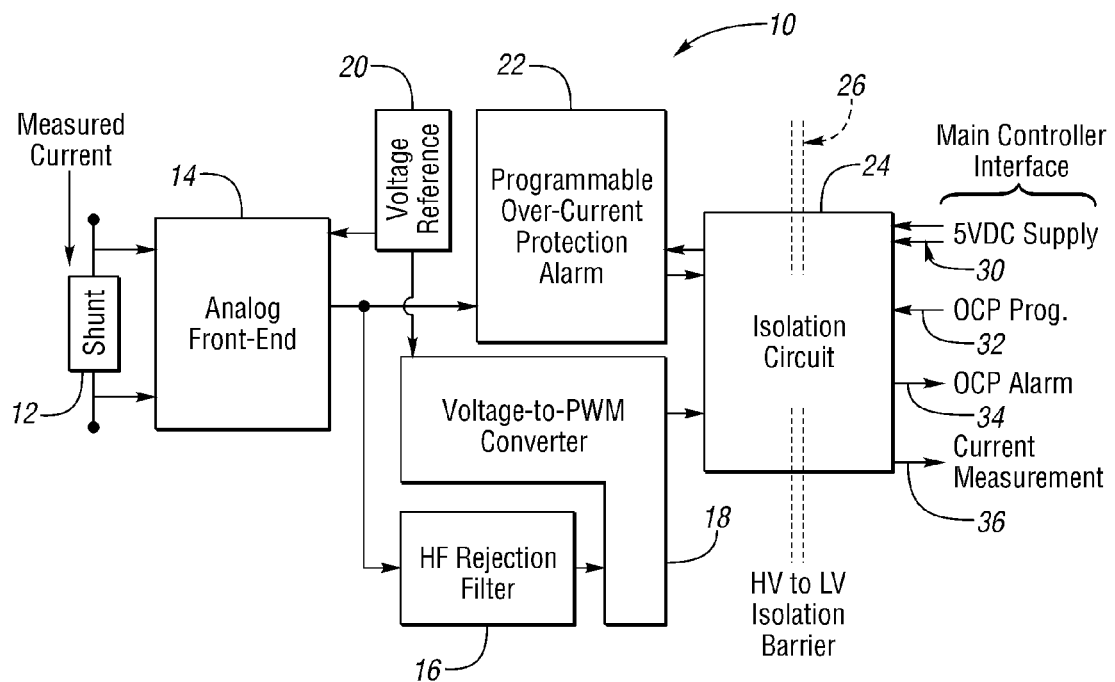
FIG. 1 depicts a block diagram of an embodiment of an isolated current sensing system made in accordance with an embodiment of the invention.

With reference to FIG. 1, an isolated current sensing system made in accordance with an embodiment of the invention is generally indicated at 10. At the sub-system level, the system 10 includes a number of components. A resistive current sense element is depicted as shunt 12. Shunt 12 is connected to analog front-end 14. Current (DC and AC) is measured through the shunt 12.

The analog front-end 14 receives a voltage from the shunt 12, and provides an analog output. The voltage is proportional to the current passing thru shunt 12. Analog front-end 14 is configured to provide input filtering for the voltage from shunt 12, and to amplify the voltage. In more detail, signal conditioning includes input filtering plus amplification, typically one or two operational amplifier stages with the needed gain-bandwidth product.

A processing circuit receives the analog output from the analog front-end 14, and provides a measurement signal indicative of the sensed current. As illustrated, a high frequency rejection filter 16 receives the signal from the analog front-end 14. This is a filter stage prior to the digitization of the current measurement. For the particular implementation, this block is built with two filters, one 2nd order 2.5 kHz filter and a 1st order 10 kHz filter. An analog-to-digital converter takes the form of a voltage-to-PWM converter 18 in the illustrated embodiment. The voltage-to-PWM converter 18 performs an analog-to-digital conversion by means of a comparison between the amplified and filtered signal coming from the analog front-end 14 and a triangle waveform generated locally to get a digital PWM signal with a duty cycle proportional to the measured current and a frequency equal to the one of the triangle waveform.

It is appreciated that the analog front-end 14, high frequency rejection filter 16, and voltage-to-PWM converter 18 described are only examples. For example, various approaches for analog-to-digital conversion are possible. Voltage-to-PWM is one possible approach.

Also illustrated in FIG. 1, voltage reference 20 provides a reference signal for both the voltage-to-PWM converter 18 and the first amplification stage in analog front-end 14 (to generate a controlled offset in the first amplifier).

A programmable over-current protection (OCP) alarm 22 receives a programming signal indicative of a threshold and receives the analog output from the analog front-end 14. The programmable over-current protection alarm 22 generates an alarm signal when the analog output exceeds the threshold.

In more detail, in the illustrated embodiment, the programming signal is in the form of a PWM waveform with a duty-cycle proportional to the magnitude of the OCP threshold. The PWM programming signal is converted into a DC voltage. The DC voltage is compared with the output from the analog front-end to generate the OCP alarm signal when the measured current is larger than the programmed threshold.

An isolation circuit 24 provides an isolation barrier 26, and is configured to pass the programming signal 32, the alarm signal 34, and the measurement signal 36 for the main controller interface thru the isolation barrier 26 via dedicated digital isolated channels. In more detail, the isolation circuit 24 separates the high-voltage side from the low-voltage side of the system 10, keeping the needed isolation barrier 26 between the control board and the high-voltage network. In one particular implementation, the barrier 26 must withstand 2.5 kVAC 1 min. The isolation circuit 24 also provides the isolated power supply to the other components in the HV side, described above, by means of a dedicated isolated DC-DC converter, from the 5 Vdc supply input 30.

Figure 2A:
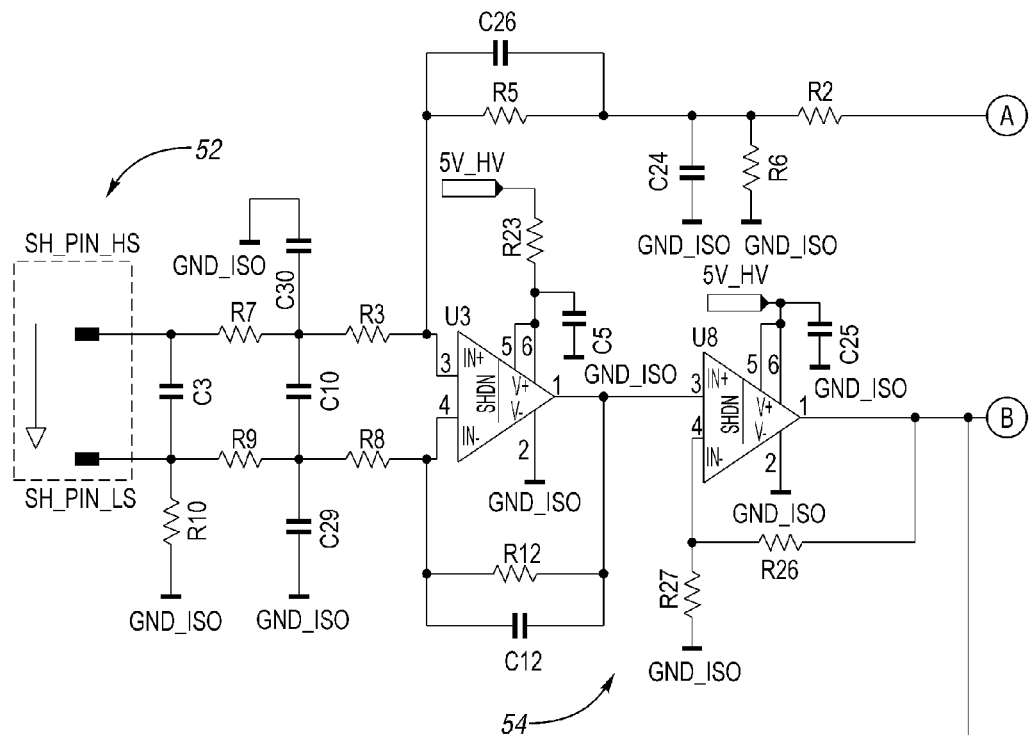
FIG. 2A-C depict a circuit diagram of an embodiment of an isolated current sensing system made in accordance with an embodiment of the invention.
Figure 2B:
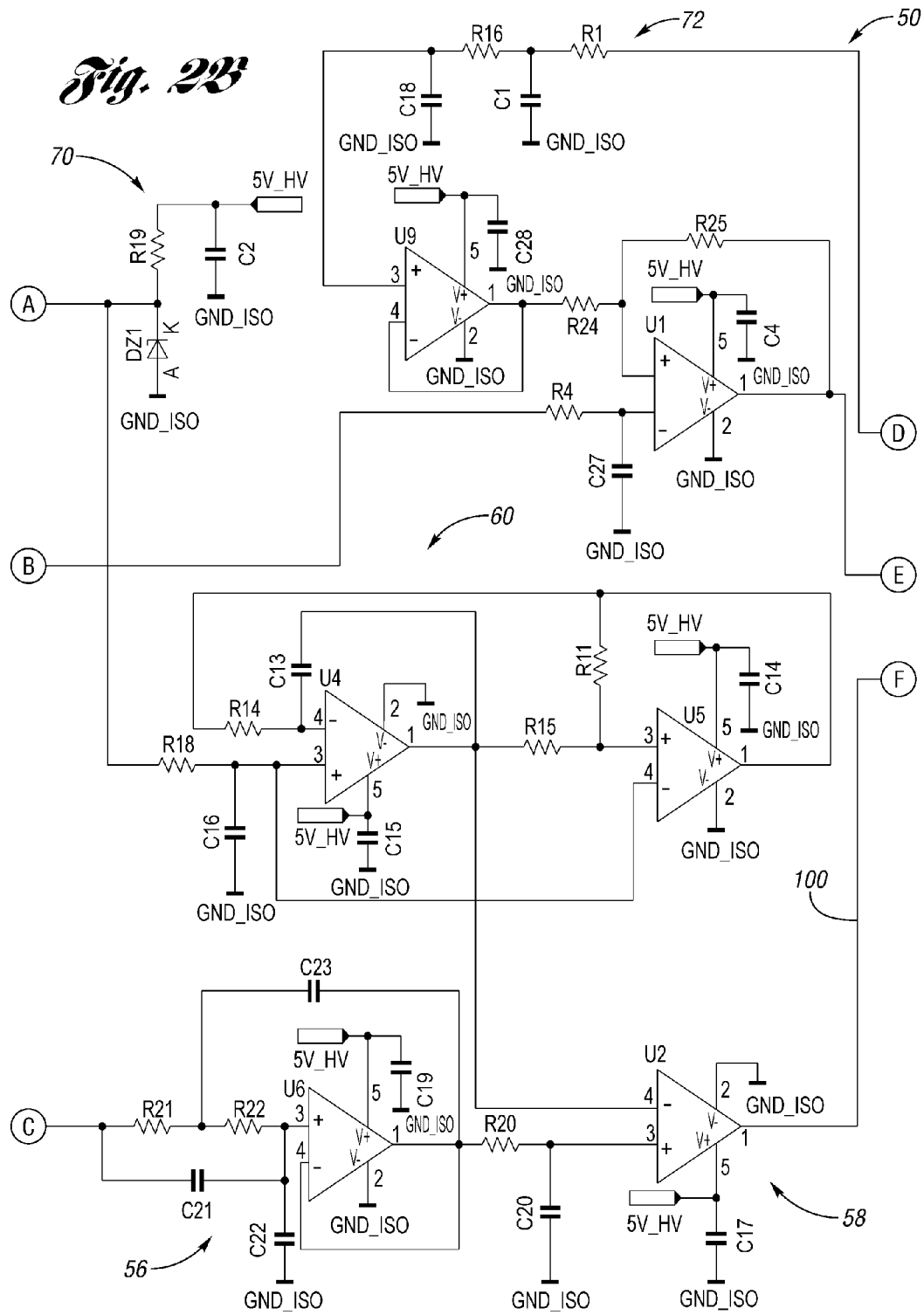
Figure 2C:
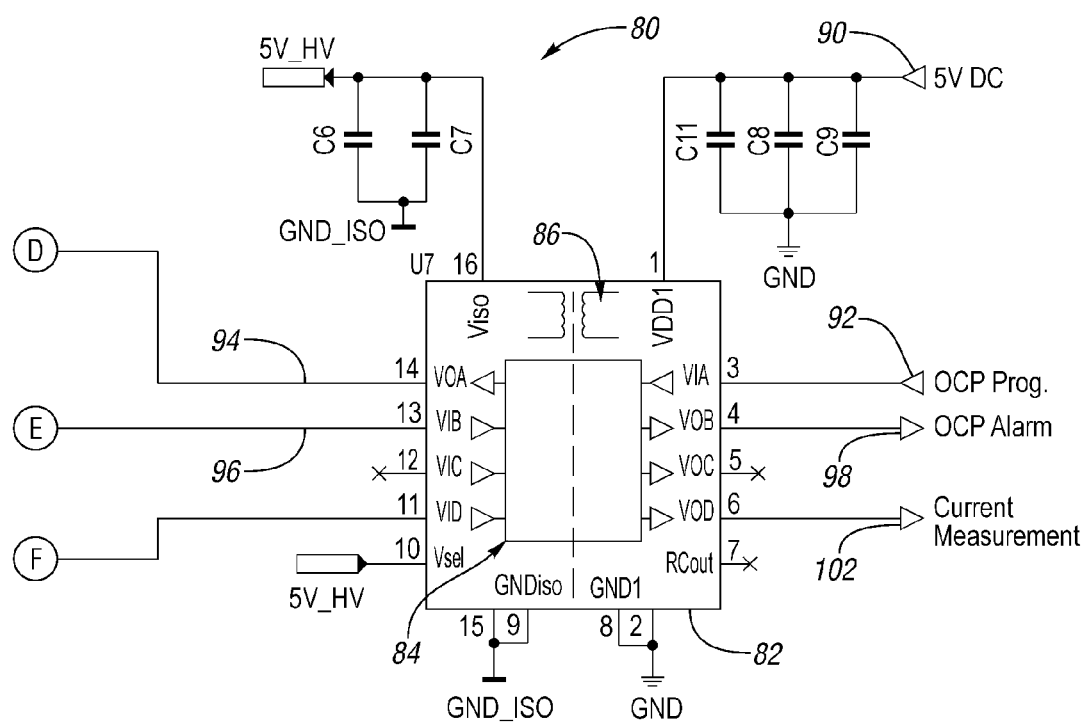

In FIG. 2A-C, a circuit diagram of an embodiment of an isolated current sensing system made in accordance with an embodiment of the invention is generally indicated at 50. The system 50 includes a number of components. The shunt element connects at 52. Connections SH_PIN_HS and SH_PIN_LS are for connecting to the resistive current sense element. The analog front-end 54 is composed of input filter circuitry including capacitors C3, C30, C10, C29. A first amplifier stage is composed of resistors R10, R7, R9, R3, R8, R5, R12; capacitors C26, C12; operational amplifier U3. A second amplifier stage is composed of resistors R27, R26; operational amplifier U8.

The high frequency rejection filter 56 is composed of resistors R21, R22, R20; capacitors C21, C22, C23, C19, C20; operational amplifier U6.

The voltage-to-PWM converter is composed of comparison circuit 58 and triangle waveform generator 60. The comparison circuit 58 is composed of operational amplifier U2 and capacitor C17. The triangle waveform generator 60 is composed of resistors R18, R14; capacitors C16, C13, C15; operational amplifier U4 (left side); resistors R15, R11; capacitor C14; operational amplifier U5 (right side).

The voltage reference 70 provides a reference signal for both the triangle waveform generator 60 and the first amplification stage in analog front-end 54 to generate a controlled offset. In more detail, voltage reference circuit 70 is composed of diode DZ1, resistor R19, capacitor C2. The voltage reference connects directly to triangle waveform generator 60. The voltage reference connects to the analog front-end 54 through a circuit composed of resistors R2, R6; capacitor C24 to create the offset; resistor R23, and capacitors C5 and C25 provide the standard decoupling for the respective integrated circuits.

The programmable over-current protection (OCP) alarm 72 receives a programming signal indicative of a threshold at an input circuit composed of resisters R1, R16; capacitors C1, C18; operational amplifier U9; capacitor C28. OCP alarm 72 receives the analog output from the analog front-end 54, and generates an alarm signal when the analog output exceeds the threshold. In more detail, the comparison circuit is composed of operational amplifier U1 which has the inverting input receiving the analog signal through resistor R4, capacitor C27. The output from operational amplifier U9 connects though resister R24 to the non-inverting input of operational amplifier U1. The comparison circuit further includes feedback resister R25, capacitor C4. The output of operational amplifier U1 is the alarm signal.

The programming signal received at R1 is in the form of a PWM waveform with a duty-cycle proportional to the magnitude of the OCP threshold. The PWM programming signal is converted into a DC voltage at the non-inverting input of operational amplifier U9.

The isolation circuit 80 provides an isolation barrier. In the illustrated embodiment, the isolation circuit 80 is composed of coupling component 82. Component 82 includes chip-scale transformers to perform the coupling. The channels are shown at 84. Component 82 also includes DC-DC converter 86. In more detail, 5V input is shown at 90 connected to input capacitors C8, C9, C11; the output side of the on-chip converter connects to capacitors C6, C7. To simplify the drawing, connectors marked 5V_HV are shown for the isolated power supply voltage output to the remainder of the circuit.

Component 82 also has a connection for isolated-ground GND_ISO, and has a ground connection GND (non-isolated side). The provided channels pass the OCP programming signal 92 (input), 94 (isolated); the OCP alarm signal 96 (isolated), 98 (output); the measurement signal 100 (isolated), 102 (output).

Figure 3:
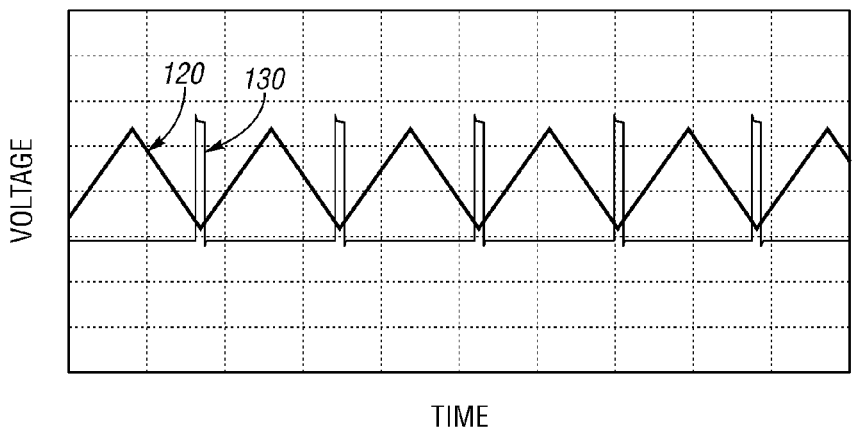
FIG. 3 illustrates a graph depicting operation of the voltage-to-PWM converter in an embodiment of the invention.

FIG. 3 illustrates a graph depicting operation of the voltage-to-PWM converter in an embodiment of the invention. The example voltage-to-PWM converter includes a waveform generator circuit that generates triangle waveform 120. The comparison circuit compares the analog output and the triangle waveform 120 to produce the digital output indicative of the sensed current. The digital output in this example takes the form of a pulse width modulated signal 130. As shown, the digital output is high when the analog output exceeds the triangle waveform.

Embodiments of the invention are not limited to those described herein. Various other embodiments are possible within the scope of the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An isolated current-sensing system for use with a resistive current sense element, the system comprising:
    an analog front-end configured to receive a voltage from the resistive current sense element, and to provide an analog output;
    a programmable over-current protection alarm configured to receive a programming signal indicative of a threshold and receive the analog output, and configured to generate an alarm signal when the analog output exceeds the threshold;
    a processing circuit configured to receive the analog output, and to provide a measurement signal indicative of the sensed current; and
    an isolation circuit providing an isolation barrier, and configured to pass the programming signal, the alarm signal, and the measurement signal passing through the isolation barrier.

2. The system of claim 1 further comprising:
    a resistive current sense element connected to the analog front-end.

3. The system of claim 1 wherein the analog front-end is further configured to provide input filtering for the voltage from the resistive current sense element.

4. The system of claim 1 wherein the analog front-end is further configured to amplify the voltage from the resistive current sense element to provide the analog output.

5. The system of claim 1 wherein the processing circuit further comprises:
    an analog-to-digital converter configured to receive the analog output, and configured to provide the measurement signal as a digital output indicative of the sensed current.

6. The system of claim 5 wherein the analog-to-digital converter further comprises:
    a waveform generator circuit; and
    a comparison circuit that compares the analog output and a generated waveform to produce the digital output indicative of the sensed current.

7. The system of claim 6 wherein the digital output is a pulse width modulated signal.

8. The system of claim 1 wherein the programmable over-current protection alarm is configured to convert the programming signal into a DC voltage representing the threshold, and includes a comparison circuit for comparing the analog output to the DC voltage and generating the alarm signal.

9. The system of claim 1 wherein the isolation circuit is further configured to provide a power supply.

10. The system of claim 1 further comprising:
    a high frequency rejection filter between the analog front-end and the processing circuit.

11. An isolated current-sensing system for use with a resistive current sense element, the system comprising:
    an analog front-end configured to receive a voltage from the a resistive current sense element, and to provide an analog output;
    an analog-to-digital converter including a waveform generator circuit and a comparison circuit, the comparison circuit receiving the analog output and comparing the analog output and a generated waveform to produce a measurement signal as a digital output indicative of the sensed current; and
    an isolation circuit providing an isolation barrier, and configured to pass the measurement signal through the isolation barrier; and
    a programmable, over-current protection alarm configured to receive a programming signal indicative of a threshold and receive the analog output, and configured to generate an alarm signal when the analog output exceeds the threshold;
    wherein the isolation circuit is further configured to pass the programming signal and the alarm signal through the isolation barrier.

12. The system of claim 11 wherein the digital output is a pulse width modulated signal.

13. The system of claim 11 wherein the programmable over-current protection alarm is configured to convert the programming signal into a DC voltage representing the threshold, and includes a comparison circuit for comparing the analog output to the DC voltage and generating the alarm signal.

14. The system of claim 11 further comprising:
    a resistive current sense element connected to the analog front-end.

15. The system of claim 11 wherein the analog front-end is further configured to provide input filtering for the voltage from the resistive current sense element.

16. The system of claim 11 wherein the analog front-end is further configured to amplify the voltage from the resistive current sense element to provide the analog output.

17. The system of claim 11 wherein the isolation circuit is further configured to provide a power supply.

18. The system of claim 11 further comprising:
    a high frequency rejection filter between the analog front-end and the analog-to-digital converter.

19. The system of claim 1 wherein the isolation circuit is to pass the programming signal, the alarm signal, and the measurement signal through the isolation barrier to a low voltage side.

20. The system of claim 11 wherein the isolation circuit is to pass the programming signal, the alarm signal, and the measurement signal through the isolation barrier to a low voltage side.

\* \* \* \* \*